(12) United States Patent
Hara et al.

(10) Patent No.: US 7,368,665 B2
(45) Date of Patent: May 6, 2008

(54) CIRCUIT BOARD AND A POWER MODULE EMPLOYING THE SAME

(75) Inventors: Masahiro Hara, Shiojiri (JP); Hideyo Osanai, Shiojiri (JP)

(73) Assignee: Dowa Mining Co., Ltd., Tokyo (JP)

( * ) Notice: Subject to any disclaimer, the term of this patent is extended or adjusted under 35 U.S.C. 154(b) by 212 days.

(21) Appl. No.: 11/270,202

(22) Filed: Nov. 9, 2005

(65) Prior Publication Data

US 2006/0062979 A1 Mar. 23, 2006

Related U.S. Application Data

(62) Division of application No. 10/768,857, filed on Jan. 29, 2004, now Pat. No. 7,008,549.

(30) Foreign Application Priority Data

Mar. 26, 2003 (JP) .............................. 2003-84828

(51) Int. Cl.
*H05K 1/03* (2006.01)
(52) U.S. Cl. ...................... 174/255; 174/261; 361/772

(58) Field of Classification Search ................ 174/261, 174/255; 361/772–779
See application file for complete search history.

(56) References Cited

U.S. PATENT DOCUMENTS

| 3,756,052 | A | 9/1973 | Quaal et al. |
| 4,325,780 | A | 4/1982 | Schulz, Sr. |
| 4,548,285 | A | 10/1985 | Sells et al. |
| 4,919,232 | A | 4/1990 | Lofton |
| 5,602,865 | A | 2/1997 | Laakmann |
| 5,666,722 | A | 9/1997 | Tamm et al. |
| 5,688,408 | A | 11/1997 | Tsuru et al. |
| 6,134,117 | A | 10/2000 | Funk et al. |
| 2001/0017422 | A1 * | 8/2001 | Oda ........................... 257/768 |

FOREIGN PATENT DOCUMENTS

JP 5-31616 A 2/1993

* cited by examiner

*Primary Examiner*—Jeremy C Norris
(74) *Attorney, Agent, or Firm*—Frishauf, Holtz, Goodman & Chick, P.C.

(57) ABSTRACT

A circuit board containing a metal-insulator composite member including an insulator substrate and a metal layer having a pattern, the composite member having an area where the spacing between a lower part of adjacent elements of the pattern on the metal layer which is in contact with the insulator is not greater than the thickness of the metal layer. Also a power module containing such circuit board.

19 Claims, 4 Drawing Sheets

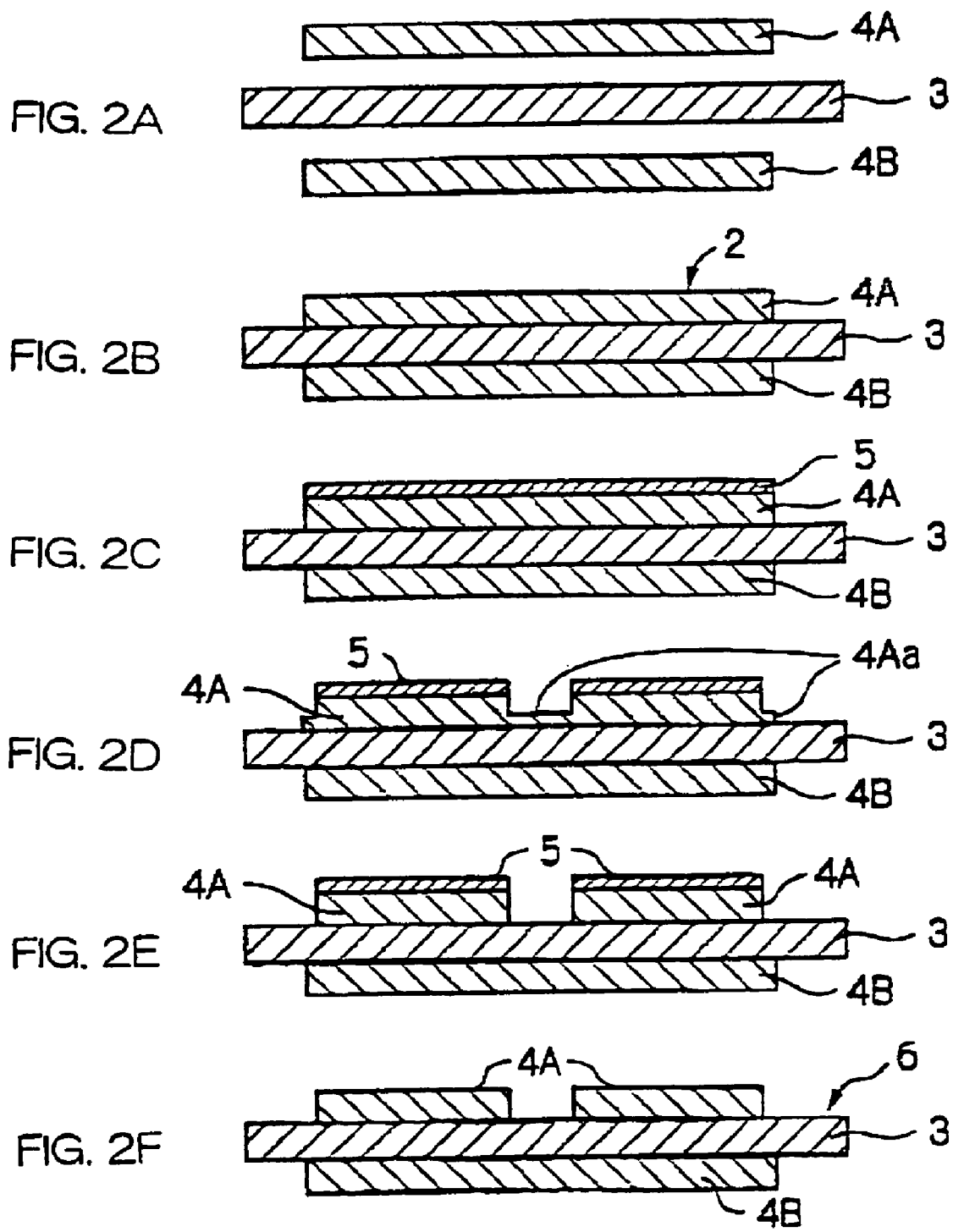

CIRCUIT BOARD AND A POWER MODULE EMPLOYING THE SAME

CROSS-REFERENCE TO RELATED APPLICATION

This application is a divisional application of application Ser. No. 10/768,857 filed Jan. 29, 2004 now U.S. Pat. No. 7,008,549.

BACKGROUND OF THE INVENTION

This invention relates to a circuit board comprising a metal-insulator composite member suitable for use as circuit boards, a process for producing the circuit board, and a power module employing the circuit board.

With recent advances in the performance of industrial machines such as robots and motors, active efforts are being made to develop and improve circuit boards for installation of power devices, particularly for mounting large-power, high-efficiency components. Typically, such circuit boards consist of a ceramic sheet with good electrical insulating properties that has a circuit forming metal member joined to one principal surface and a metal member as a heat sink joined to the other principal surface. In forming circuit patterns, considerations have been taken, mostly in thermal aspects including the control of the thermal expansion mismatch between the ceramic sheet and the metal member, reduction of the concentration of thermal stress in the composite member, and improvement of resistance to thermal impact. For example, in order to reduce the concentration of thermal stress on the circuit board that will occur if cracks develop as the result of heat cycling or heat shock, it has been proposed that a large number of slits be provided in the circuit forming metal plate (see, for example, JP 4-343287A).

In the prior art, circuit patterns are mostly formed by either a method in which the printing of an etching resist on the metal plate joined to the ceramic substrate is followed by etching with a solution of ferric chloride, or a method in which a metal layer preliminarily pressed to form a pattern is then joined to the ceramic substrate. However, processing by these methods involve the following problems which need to be solved.

If the metal layer is thick (say, 0.3 mm or more), it requires a lot of time to etch and there will be variations in dimensional precision if the liquid etchant is not applied uniformly; in addition, there will be a difference in width between the upper and lower parts of an element of a pattern in the metal layer, which may potentially impede the formation of a desired circuit pattern. In order to ensure that treatment with liquid chemicals is performed in a consistent and safe way, temperature cannot be raised to very high level and a lot of time is required to dissolve the metal layer. Some liquid etchants have a further problem in that their life is shortened if they are employed to dissolve certain metals such as aluminum. Potential instability in patterns cannot be eliminated even if the exposure method is applied to resist formation.

Yet another problem with the thick metal layer is that on lateral sides of the metal circuit portion, taper angle and step width are extremely difficult to control and prone to become uneven. What is more, fine-line patterning technology is required in resist printing.

In order to etch in predetermined dimensions, the resist printing plate must preliminarily be adjusted to a greater size considering the etch rate but then fine-line patterned shapes cannot be obtained.

A further problem with ordinary resist printing methods is that the plate must be changed for each pattern to be formed.

The method of first pressing the metal layer (sheet) to form a pattern and joining it to the substrate requires the preparation of a mold and is not suitable for manufacturing many types of circuit boards in small quantities. As a further problem, if a thick metal layer (sheet) is processed to have a fine-line pattern and joined to the substrate by heat, thermal expansion, misregistry with the insulator and other problems occur, making it difficult to secure high dimensional precision. Considerable difficulty is also involved in providing lateral sides of a pattern element with precise step shapes to be described later for the purpose of stress relaxation.

Therefore, the primary objective of the present invention is to provide an improved technique for forming circuit patterns on circuit boards made of metal-insulator composites, characterized as being independent on the thickness of the metal layer and capable of reducing the etching load and the resist process load while assuring improved dimensional precision. More particularly, the invention aims at providing a versatile technique that is applicable to the formation of many kinds of circuit patterns and which is characterized in that even if the metal layer is thick, the etch time is shortened and the sagging of edge faces is reduced, whereby the dimensional precision and shape reproducibility of circuit patterns are sufficiently improved to enable reduction of the spacing between adjacent elements of the circuit pattern as compared to the thickness of the metal layer.

SUMMARY OF THE INVENTION

In order to attain the stated objects, the present inventors made intensive studies and found that if those portions of the metal layer which are to be removed are physically ground by the milling operation which is correctly controlled in position by computer or otherwise, the non-uniformity which is often encountered in treatment with liquid chemicals is reduced while producing circuit boards that are precise and versatile (applicable to many kinds of circuit patterns).

The present invention consists of three aspects, a process for producing an improved circuit board, a circuit board produced by the method, and a power module employing the circuit board. According to the first aspect of the invention, the following processes are provided.

1. A process for producing a circuit board comprising the steps of forming a metal layer on at least one surface of an insulator to prepare a metal-insulator composite member and then milling at least a portion of said metal layer to form a pattern.
2. A process for producing a circuit board comprising the steps of forming a metal layer on at least one surface of an insulator to prepare a metal-insulator composite member, then milling at least a portion of said metal layer, and subsequently performing etching to form a pattern.
3. A process for producing a circuit board comprising the steps of forming a metal layer on at least one surface of an insulator to prepare a metal-insulator composite member, then forming an etching resist on all or part of the surface of said metal layer, milling at least a portion of said metal layer, subsequently performing etching, and then removing said etching resist to form a pattern.

4. A process for producing a circuit board comprising the steps of forming a metal layer on at least one surface of an insulator to prepare a metal-insulator composite member, then milling at least a portion of said metal layer, forming an etching resist on all or part of the surface of said metal layer, subsequently performing etching, and then removing said etching resist to form a pattern.
5. A process for producing a circuit board comprising the steps of forming a metal layer on at least one surface of an insulator to prepare a metal-insulator composite member, then milling at least a portion of said metal layer, thereafter milling at least a portion of said metal layer with an end mill different from the one employed in the first milling step so as to form a pattern.
6. A process for producing a circuit board comprising the steps of forming a metal layer on at least one surface of an insulator to prepare a metal-insulator composite member, then milling at least a portion of said metal layer, thereafter milling at least a portion of said metal layer with an end mill different from the one employed in the first milling step, and subsequently performing etching to form a pattern.
7. A process for producing a circuit board comprising the steps of forming a metal layer on at least one surface of an insulator to prepare a metal-insulator composite member, then milling at least a portion of said metal layer, thereafter performing etching, and subsequently milling at least a portion of said metal layer with an end mill different from the one employed in the first milling step so as to form a pattern.
8. The process according to item 6 or 7, wherein prior to said etching, an etching resist is formed on all or part of the surface of said metal layer, and said etching resist is removed after said etching.
9. The process according to item 8, wherein said etching resist is formed prior to the first of said two milling steps.
10. The process according to any one of items 1-9, wherein at least a portion of said metal layer is milled with an end mill having a stepped or tapered cutting edge.
11. The process according to any one of items 1-10, wherein said milling operation is a wet process which applies a liquid lubricant to the area of contact between the work and the end mill.
12. The process according to item 11, wherein said wet process is performed with cold air being blown to cool the area of contact between said work and said end mill.
13. The process according to item 1 or 5, wherein at least a portion of said insulator is milled after milling said metal layer.
14. The process according to any one of items 5-13, wherein said pattern has a step on lateral sides of an element.

According to the second aspect of the invention, the following circuit boards are provided.

15. A circuit board comprising a metal-insulator composite member which has an area where the spacing between the lower parts of adjacent elements of a pattern on the metal layer is not greater than the thickness of said metal layer.
16. The circuit board according to item 15, wherein the thickness of said metal layer is at least 0.2 mm.
17. The circuit board according to item 15 or 16, wherein said metal layer is made of aluminum, copper, silver, nickel or an alloy thereof.
18. The circuit board according to any one of items 15-17, wherein said insulator is based on aluminum oxide, aluminum nitride, silicon oxide, silicon nitride or silicon carbide.
19. The circuit board according to any one of items 15-18, wherein said metal-insulator composite member has said metal and said insulator united by direct joining, brazing, melt joining or plating.
20. The circuit board according to any one of items 15-19, wherein all or part of the surface of said metal layer is plated with nickel, copper, gold, silver, palladium, tin or an alloy thereof.
21. The circuit board according to any one of items 15-20, which can withstand at least 1000 heat cycles.

According to the third aspect of the invention, there is provided the following power module.

22. A power module employing the circuit board according to any one of items 15-21.

BRIEF DESCRIPTION OF THE DRAWINGS

FIGS. 2A-2F are sectional views showing the sequence of steps in the process of forming a circuit pattern in Example 1 of the application;

DETAILED DESCRIPTION OF THE INVENTION

Figures 1A, 1B, 1C, 1D:
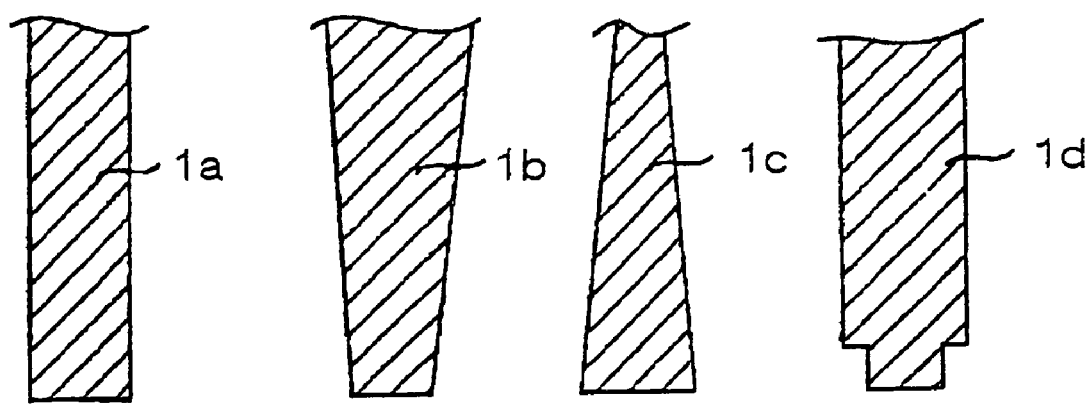
FIGS. 1A-1D are longitudinal sections showing various types of tools of end mill that can be used in the invention.
Figure 3A:
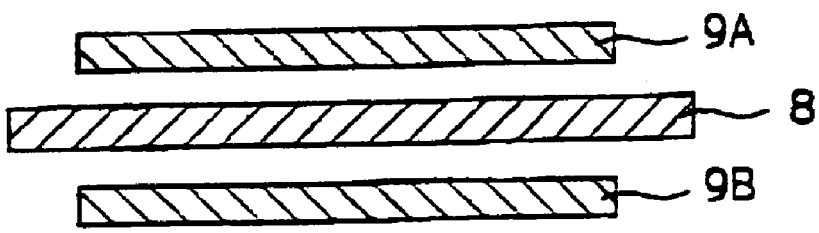
FIGS. 3A-3G are sectional views showing the sequence of steps in the process of forming a circuit pattern in Example 2 of the application.
Figure 3B:
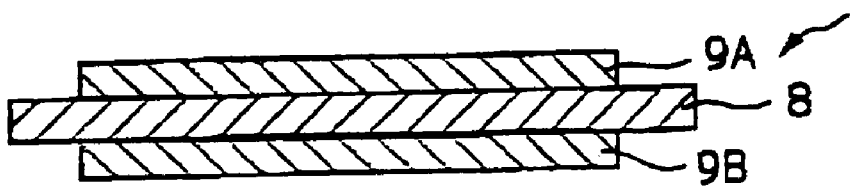
Figure 3C:
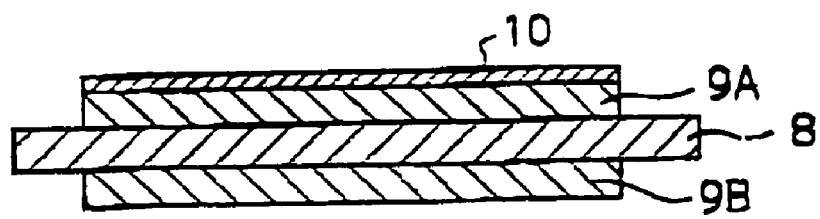
Figure 3D:
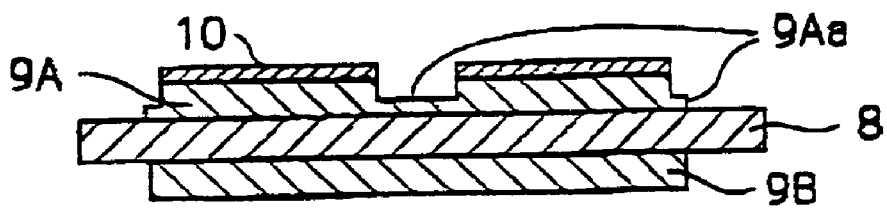
Figure 3E:
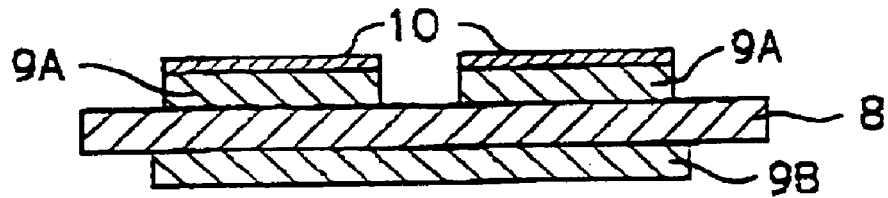
Figure 3F:
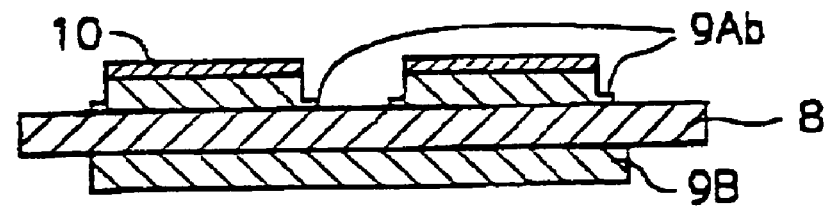
Figure 3G:
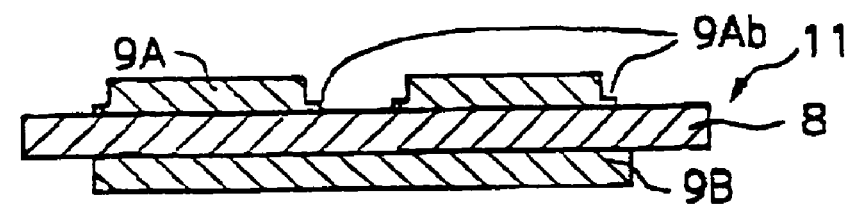

In one embodiment of the invention, a circuit pattern is formed on a metal-insulator composite member by the following procedure: the two principal surfaces of an insulator substrate are overlaid with two metal layers of identical shape and area in generally symmetrical positions, the metal layer joined to one principal surface serving as a circuit forming member and the metal layer joined to the other principal surface serving as a heat sink member, and then the unwanted portions of the metal layer on the circuit forming side are removed by milling.

Milling is a well-known machining process by which a surface is generated progressively by the removal of chips from workpiece fed into a rotating end mill or various other types of milling cutter having a large number of teeth or cutting edges.

In the milling process, all unwanted portions of the metal can be removed by a single milling cutter and high operating efficiency is obtained. However, the substrate itself is not completely flat but has some degree of warpage or waviness. In addition, warpage may be introduced into the substrate by the process of milling. In some areas of the substrate, the aluminum layer needs to be left unremoved but if the warpage of the substrate is greater than the amount of the remaining aluminum, the milling cutter may contact the insulator to cause cracking. As a further problem, the thin substrate has such low strength that vibration from the milling process may also cause cracking.

If there is a possibility that the milling cutter contacts the insulator to cause cracking, a single milling cutter may be employed to remove the greater part of the unwanted portion of the metal layer so that a specified minimum thickness of it remains and the remaining metal layer is subsequently removed by etching. In this way, a circuit pattern can be formed without developing cracks due to warpage and other defects of the substrate.

In some cases, the contact between the milling cutter and the insulator can be avoided by performing three-dimensional simultaneous control over the relative positions of the substrate and the end mill mounted on a milling machine.

In the process of the invention, etching suffices to be performed lightly and the intended result can be easily obtained within such a short period that deterioration of the liquid etchant by the contaminating metal component can be effectively suppressed.

In order to ensure that the surfaces and lateral sides of pattern elements will maintain satisfactory shapes, an etching resist is preferably formed prior to the etching step so that no undesirable etching will occur. Since the etching process lasts for only a short period, the resist film may be thin, typically in the range of 2-10 μm compared to the range 12-14 μm which has heretofore been necessary in the case of blanket application. Milling is also effective in the case of blanket application (i.e. forming the resist film over the entire surface of the metal layer), thereby contributing to higher production rate. The etching resist may be uv- or heat-curable and an alkali-strippable type is commonly employed.

By performing milling in two stages such that elements of a circuit pattern are each provided with a step in a position near the lowest part of its lateral sides, the stress on the insulator can be reduced. In order to form stepped lateral sides, two end mills may be employed as milling cutters in such a way that the first end mill cuts the metal layer to its bottom whereas the second end mill having a slightly larger diameter than the first one mills the metal layer by a specified thickness short of the bottom. This two-stage milling process can also be applied to the case where cutting with the first end mill is performed to a specified level close to the bottom of the metal layer and the remaining metal layer is etched away. Another possible application is where a resist film is preliminarily formed on the surface of the metal layer.

As an alternative method of forming stepped lateral sides by two-stage milling, the first end mill may cut the metal layer by a specified thickness short of its bottom and the second end mill having a smaller diameter than the first one is employed to cut the metal layer to the bottom.

In other words, stepped lateral sides can be formed whichever of the two end mills having different diameters is applied first. In addition, the two-stage milling process may suitably be combined with the formation of an etching resist or the etching process.

While an end mill is preferred as the milling cutter, a suitable shape of cutting edge may be chosen as appropriate from the various geometries shown in FIGS. 1A-1D. To begin with, elements of a circuit pattern having vertical lateral sides can be formed with a cylindrical tool as indicated by 1a in FIG. 1A. Second, tapered sides can be formed with a tool of an inverted frustoconical shape as indicated by 1b in FIG. 1B. Tapered sides offer the advantage of stress relaxation. Thirdly, inversely tapered sides can be formed with a tool of a frustoconical shape as indicated by 1c in FIG. 1C. Fourthly, by employing a tool having a step at the tip as indicated by 1d in FIG. 1D, the aforementioned two-stage milling process for providing stepped lateral sides can be accomplished with a single end mill. The end mills can be driven to rotate either pneumatically or by means of an electric motor. If fast rotation is required, the end mills are preferably driven with an electric motor.

Burrs occasionally form on edges of the metal member as it is milled and the linearity and surface geometries of pattern elements having unduly large burrs become unsuitable for circuit boards. If milling is performed after forming an etching resist, not only the burrs but also the etching resist in nearby areas are taken so that the resist suffers heavier damage on end faces of pattern elements, often leading to uneven etching and other defects.

Burring can be suppressed by one of the following methods: 1) the rpm of the end mill as the milling cutter is increased; 2) increasing the rake angle of the end mill; 3) lubricating the tip of a cutting edge (tooth) at which the end mill contacts the work; and 4) local cooling of the tip at which the end mill contacts the work. Burring depends on the cutting speed and as will be shown later in Table 1 at the end of Comparative Example, best test results were obtained at speeds of 5-7 mm/sec in dry milling and at 25-40 mm/sec in wet milling.

The dimensional precision of machining with an end mill having a diameter of 1 mm is well within ±0.30 mm which has typically been required of conventional circuit boards.

The process of the invention has very high productivity and compared to the conventional case of forming circuit patterns by etching alone which requires as many as 25 minutes, an end mill having a diameter of 1 mm shortens the dry cutting time to about 240 seconds and the wet cutting time to about 40 seconds, with the etching time shortened to between 1 and 5 minutes.

If the work is milled as it is cooled with cold air, the efficiency of heat dissipation is improved to give better results.

In the metal-insulator composite member of the invention, the metal layer is typically made of aluminum, copper, nickel, silver or an alloy thereof and the insulator is typically made of ceramics including aluminum oxide, aluminum nitride, silicon oxide, silicon nitride and silicon carbide, as well as insulating resins.

In the process of the invention which involves the milling operation, the insulator and the metal member must be united at a joint strength of at least 0.1 kgf/cm and the circuit board as the final product preferably has a joint (peel) strength of at least 5 kgf/cm. The two members can be united by various known methods including a direct joining process in which the two members are brought into direct contact with each other and thermally joined together, a brazing process in which a brazing material placed between the two members is heated to unite them, a melt joining process in which a ceramic member as the insulator is dipped in a molten metal to cover its surfaces with the metal, and a plating process.

The metal-insulator composite member prepared in the manner described above may be plated with gold, silver, copper, nickel, palladium, tin or alloys thereof on the entire surface or in selected areas so that the circuit pattern is finished to have improved characteristics such as good electrical conductivity.

If the metal layer is thick, there is a particularly great need of patterning the metal-insulator composite member by milling. Etching has the problem of creating a dimensional mismatch such that the lower part of the metal layer where it joins to the insulator is larger than the upper part and this dimensional mismatch increases as the metal layer becomes thicker. In order to reduce the dimensional mismatch, prolonged etching is required but this is not economical. More importantly, pattern elements cannot have the desired size unless the etching resist mask is made somewhat larger than the elements. The oversize of the mask must increase in a planar direction as the metal layer becomes thicker. This means the spacing between adjacent elements of a pattern cannot be made smaller than the thickness of the metal layer.

To state more specifically, circuit boards for installation of power modules require metal layers as thick as at least 0.2 mm but if etching is employed, circuits cannot be fabricated with the spacing between the lower parts of pattern elements (the insulation spacing) being smaller than 0.2 mm.

This problem is absent from the milling operation in the process of the present invention. The spacing between elements of a circuit pattern can be set not by the thickness of the metal layer but by the diameter of the end mill, and the dimensional mismatch between the upper and lower parts of each pattern element can be set by the geometry of the tip of the end mill. Thus, by choosing an end mill tip of a suitable diameter and geometry, one can realize an inter-element spacing smaller than the thickness of the metal layer.

In another conventional process for manufacturing circuit boards, a metal plate is pressed or otherwise worked to form a pattern of a specified feature size and then joined to an insulator. This process can produce fine patterns by the pressing technique but, on the other hand, subsequent thermal expansion will cause adjacent elements of the pattern to contact each other or bring them into misregistry with the insulator; as a result, it has been impossible to fabricate a circuit board having a smaller spacing between pattern elements than the thickness of the metal layer.

The following examples are provided for further illustrating the present invention but are in no way to be taken as limiting its technical scope.

EXAMPLE 1

According to the scheme shown in FIGS. 2A-2F, a circuit pattern was formed on a metal-insulator composite member 2 employing a milling machine (product of MITS Co., Ltd.) In steps A and B, a ceramic substrate 3 made of aluminum nitride with a purity of at least 98.8% and which had a thickness of 0.635 mm was brought into contact with aluminum sheets 4A and 4B of identical shape and area at a thickness of 0.4 mm, 4A serving as a circuit forming metal layer and 4B as a heat sink providing metal layer; the assembly was heated in an inert atmosphere at 740° C. for 60 minutes and then cooled down (i.e. direct joining) to prepare a composite member 2. In step C, an etching resist 5 made of an acrylic resin was applied to the entire surface of the aluminum sheet 4A in the composite member 2. Subsequently, in step D, the composite member was mounted on the milling machine and, with the end mill being subjected to three-dimensional simultaneous control by computer, the aluminum layer 4A was milled as it was cooled with an oily cutting fluid. To be more specific, the unwanted areas of the aluminum sheet (the grooves between circuit elements and the lateral sides of their perimeter) were removed by cutting with the end mill having a diameter of 1 mm such that a residual aluminum layer 4Aa would be left intact in a thickness of 50 μm. Thereafter, in step E, a liquid etchant consisting of 30-40% ferric chloride, 5-15% hydrochloric acid and water to 100% was applied to remove the remaining aluminum layer 4Aa, and in step F, the etching resist 5 was removed from the surface of the aluminum sheet 4A to make a circuit board 6.

The circuit board 6 was found to be satisfactory in the absence of any warpage and cracking. The joint strength between each of the aluminum sheets 4A and 4B and the ceramic sheet 3 (as measured in a vertical direction by peeling either aluminum sheet until it came off the ceramic sheet) was 20 kgf/cm.

The difference in width between the upper and lower parts of each pattern element was less than 0.1 mm.

The circuit board was subjected to a heat cycling test in the following manner. Cycles of thermal impact, each consisting of room temperature (RT), −40° C.×30 min, RT×10 min, +125° C.×30 min and RT×10 min, were applied to the circuit board and after 1000 cycles, the aluminum layer on the ceramic substrate was removed with a liquid stripper and the substrate's surface was checked for the occurrence of cracking. No cracks were found.

EXAMPLE 2

The procedure of Example 1 was repeated, except in accordance with the scheme shown in FIG. 3, to fabricate a circuit board by forming a circuit pattern on an aluminum-ceramic composite member 7.

In steps A and B, a ceramic sheet 8 made of 96% pure alumina and which had a thickness of 0.25 mm was united by direct joining to aluminum sheets 9A and 9B on both principal surfaces, thereby preparing a composite member 7. In step C, an etching resist 10 was applied to the side of the composite member 7 where a circuit pattern was to be formed. Subsequently, in step D, the composite member 7 was mounted on the milling cutter and the unwanted areas of the aluminum layer 9A were removed by cutting with an end mill having a diameter of 1 mm such that a residual aluminum layer 9Aa would be left intact in a thickness of 50 μm. Thereafter, in step E, etching was performed to remove the remaining aluminum layer 9Aa. In subsequent step F, an end mill having a larger diameter of 1.2 mm was set in registry with the milled grooves between circuit elements and the lateral sides of their perimeter and operated to mill those portions, leaving behind skirts 9Ab in a specified thickness of 0.35 mm. Then, in step G, the etching resist 10 was removed from the surface of the formed circuit to make a desired circuit board 11.

The thus obtained insulated circuit board 11 was found to be satisfactory in the absence of any warpage and cracking. The joint strength between each of the aluminum sheets 9A and 9B and the ceramic sheet 8 was 20 kgf/cm.

The circuit board was subjected to a heat cycling test as in Example 1. After 1000 cycles, no cracks were found on the ceramic substrate.

EXAMPLE 3

An aluminum-ceramic composite member was coated with an etching resist and milled with an end mill having a diameter of 1 mm as in Example 1. The composite member was prepared by direct joining of a 0.25-mm thick alumina sheet with two 0.4-mm thick aluminum sheets, one for providing a circuit and the other for a heat sink, in which the assembly was heated and then cooled down in an inert gas atmosphere.

Figure 4:
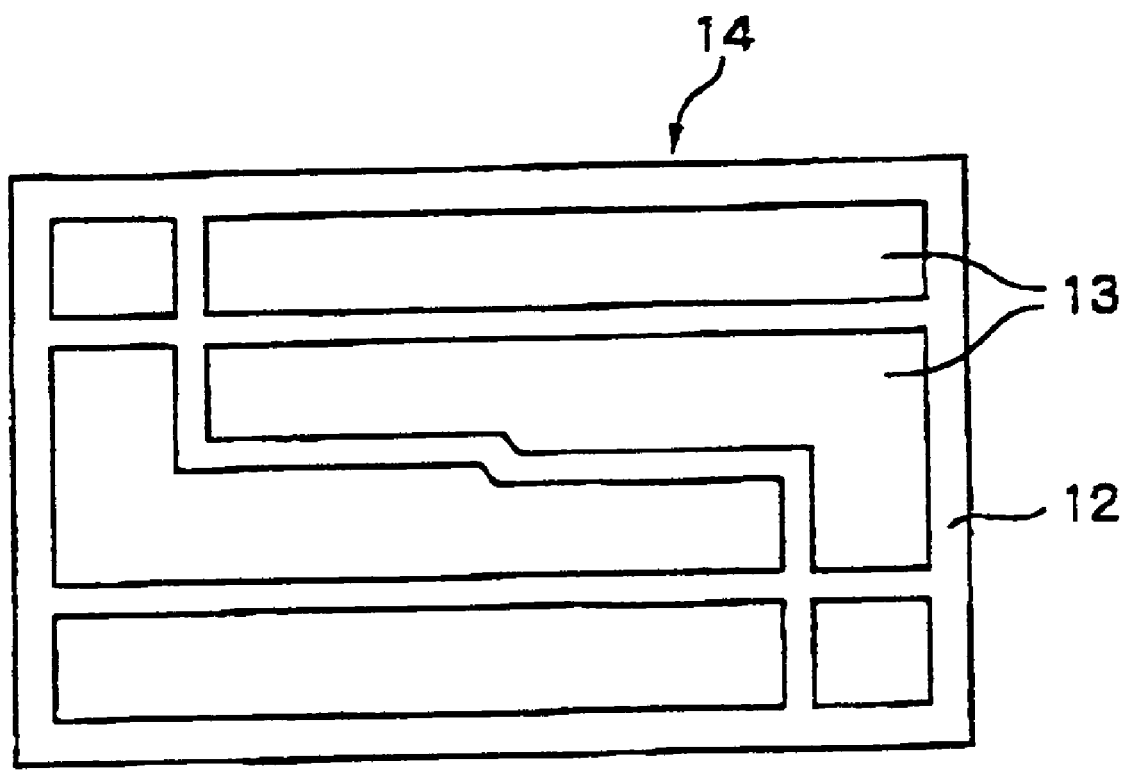
FIG. 4 is a schematic diagram of the circuit board fabricated in Example 3 of the application.

The composite member was milled with a milling machine according to the circuit diagram shown in FIG. 4 under various conditions including rpm, cutting speed and time, thereby making eight samples of circuit board 14 each having a circuit made of an aluminum layer 13 on a ceramic substrate 12. The milling conditions and the results obtained are shown in Table 1 for the respective sample Nos. 1-8.

Sample Nos. 1 and 3 were measured for the dimensional precision of slit width (inter-element spacing) at 9 locations and the results were satisfactory as shown in Table 2.

In the next place, the milled circuit boards were etched. In sample Nos. 4 and 5 which had been milled in a dry state, edges of the etching resist locally came off the aluminum layer. Most probably, the cutting speed was so high in the dry state that heavy burrs formed to affect the etching resist film, with the result that the liquid etchant got into the spalling areas, producing nicks in elements of the pattern. Sample Nos. 6-8 which had been milled in a wet state could be etched to produce satisfactory patterns.

Thus, it is concluded that cutting speeds faster than 10 mm/sec in a dry state are not suitable for producing precise and good-looking patterns but when manufacturing products of a design that allows for ignoring nicks at edges of pattern elements, such high speeds can realize very rapid cutting and hence are economically advantageous. In wet milling, high productivity is obtained since the cutting speed can be increased to 5-10 times as fast as in dry milling and patterns of good appearance can still be produced.

The samples of circuit board prepared in Example 3 were subjected to a heat cycling test as in Example 1. After 1000 cycles, no cracks were found on the ceramic substrate.

EXAMPLE 4

Sample Nos. 9 and 10 were prepared by the same process as employed to prepare sample No. 6 except that the thickness of the Al sheets was changed to 0.6 mm and 0.3 mm, respectively, and that an end mill having a diameter of 0.3 mm was employed. Both samples had satisfactory patterns, showing the present invention is effective independent of the thickness of the Al sheets and the inter-element spacing (the diameter of the end mill). The dimensional difference between the upper and lower parts of each pattern element was less than 0.1 mm. The difference between a maximum and a minimum value of the inter-element spacing was within 50 μm.

The samples of circuit board prepared in Example 4 were subjected to a heat cycling test as in Example 1. After 1000 cycles, no cracks were found on the ceramic substrate.

COMPARATIVE EXAMPLE

The assemblies prepared in Example 4 were etched in order to fabricate circuit boards having an inter-element spacing of 0.3 mm. To begin with, an etching resist was formed over the insulator and on the surfaces of the metal layers which were respectively 0.6 mm and 0.3 mm thick. Those metal layers were etched with a solution of ferric chloride for respective periods of 40 and 20 minutes. The areas of the metal layers that were close enough to the substrate surface could be effectively etched to provide an inter-element spacing of 0.3 mm; on the other hand, the middle of the metal layers in the direction of their thickness was not completely etched and no satisfactory circuit board could be fabricated.

TABLE 1

| Sample No. | Thickness of Al layers, mm | Diameter of end mill, mm | RPM | Speed, mm/sec | Time, sec | Nicks in pattern elements |
|---|---|---|---|---|---|---|
| 1 | 0.4 ± 0.03 | 1 | $8 \times 10^4$ | 5 | 660 | None |
| 2 | 0.4 ± 0.03 | 1 | $10 \times 10^4$ | 5 | 600 | |
| 3 | 0.4 ± 0.03 | 1 | $10 \times 10^4$ | 7 | 480 | |
| 4 | 0.4 ± 0.03 | 1 | $8 \times 10^4$ | 15 | 180 | On edges |
| 5 | 0.4 ± 0.03 | 1 | $10 \times 10^4$ | 10 | 300 | |
| 6 | 0.4 ± 0.03 | 1 | $6 \times 10^4$ | 25 | 64 | None |
| 7 | 0.4 ± 0.03 | 1 | $6 \times 10^4$ | 35 | 50 | |
| 8 | 0.4 ± 0.03 | 1 | $6 \times 10^4$ | 40 | 40 | |

TABLE 1-continued

| Sample No. | Thickness of Al layers, mm | Diameter of end mill, mm | RPM | Speed, mm/sec | Time, sec | Nicks in pattern elements |
|---|---|---|---|---|---|---|
| 9 | 0.6 ± 0.03 | 0.3 | $6 \times 10^4$ | 25 | 64 | |
| 10 | 0.3 ± 0.03 | 0.3 | $6 \times 10^4$ | 25 | 64 | |

TABLE 2

| Sample No. | Rated value | Average | Maximum | Minimum |
|---|---|---|---|---|
| 1 | 1.1 ± 0.3 | 1.101 | 1.118 | 1.094 |
| 3 | 1.1 ± 0.3 | 1.180 | 1.203 | 1.164 |

As described on the foregoing pages, according to the present invention, the etching time, deterioration of liquid etchant and other etching loads are reduced and unlike in the case of fabricating circuit boards solely by the etching process, there is no need to change screen printing plates for different circuit patterns. Compared to the etching process, the method of the invention assures high uniformity in the circuit forming process, improves the dimensional precision in inter-element spacing and the linearity of pattern elements, allows for choosing a desired taper angle, and enables the formation of more erect skirts and hence fine-line patterns.

Since the process of the invention is based on milling, etching needs to be done by only a small extent and the amount of the work that needs to be removed by etching is sufficiently small to reduce the load of the resist process as exemplified by the capability for blanket application of an etching resist.

As a further advantage, the process of the invention is versatile and applicable to the making of various types of circuit patterns. It is also applicable to the making of pattern elements in various cross-sectional shapes and enables the taper angle to be set and steps to be formed in any desired way.

The process of the invention offers yet another advantage in that the inter-element spacing can be reduced relative to the thickness of the metal layer, thereby forming circuit patterns of high precision.

What is claimed is:

1. A circuit board comprising a metal-insulator composite member comprising an insulator substrate and a metal layer having a pattern, the composite member having an area where the spacing between a lower part of adjacent elements of the pattern on the metal layer which is in contact with the insulator is not greater than the thickness of said metal layer, wherein the thickness of said metal layer is at least 0.2 mm.

2. The circuit board according to claim 1, wherein said metal layer is made of a metal selected from the group consisting of aluminum, copper, silver and nickel, or an alloy thereof.

3. The circuit board according to claim 2, wherein said insulator comprises aluminum oxide, aluminum nitride, silicon oxide, silicon nitride or silicon carbide.

4. In a power module comprising a circuit board, the improvement wherein the circuit board is according to claim 2.

5. The circuit board according to claim 1, wherein said metal layer is made of a metal selected from the group consisting of aluminum, copper, silver and nickel, or an alloy thereof.

6. The circuit board according to claim 5, wherein said insulator comprises aluminum oxide, aluminum nitride, silicon oxide, silicon nitride or silicon carbide.

7. The circuit board according to claim 1, wherein said insulator comprises aluminum oxide, aluminum nitride, silicon oxide, silicon nitride or silicon carbide.

8. In a power module comprising a circuit board, the improvement wherein the circuit board is according to claim 7.

9. The circuit board according to claim 1, wherein said insulator comprises aluminum oxide, aluminum nitride, silicon oxide, silicon nitride or silicon carbide.

10. The circuit board according to claim 1, wherein said metal layer and said insulator are united by direct joining, brazing, melt joining or plating.

11. In a power module comprising a circuit board, the improvement wherein the circuit hoard is according to claim 10.

12. The circuit board according to claim 1, wherein said metal layer and said insulator are united by direct joining, brazing, melt joining or plating; said metal layer is made of a metal selected from the group consisting of aluminum, copper, silver and nickel, or an alloy thereof.

13. The circuit board according to claim 12, wherein said insulator comprises aluminum oxide, aluminum nitride, silicon oxide, silicon nitride or silicon carbide.

14. The circuit board according to claim 1, wherein all or part of a surface of said metal layer is plated with a metal selected from the group consisting of nickel, copper, gold, silver, palladium and tin, or an alloy thereof.

15. The circuit board according to claim 1, wherein all or part of a surface of said metal layer is plated with a metal selected from the group consisting of nickel, copper, gold, silver, palladium and tin, or an alloy thereof; said metal layer and said insulator are united by direct joining, brazing, melt joining or plating; and said metal layer is made of a metal selected from the group consisting of aluminum, copper, silver and nickel, or an alloy thereof.

16. The circuit board according to claim 15, wherein said insulator comprises aluminum oxide, aluminum nitride, silicon oxide, silicon nitride or silicon carbide.

17. The circuit board according to claim 1, wherein said circuit board can withstand at least 1000 heat cycles.

18. In a power module comprising a circuit board, the improvement wherein the circuit board is according to claim 1.

19. In a power module comprising a circuit board, the improvement wherein the circuit board is according to claim 1.

* * * * *